(12) United States Patent
An et al.

(10) Patent No.: US 7,495,463 B2
(45) Date of Patent: Feb. 24, 2009

(54) SYSTEM AND METHOD FOR TRANSFERRING TRAYS WITHIN A TEST HANDLER

(75) Inventors: Jung Ug An, Cheonan-Si (KR); Hae Jun Park, Asan-Si (KR); Kyung Min Hyun, Cheonan-Si (KR); Wan Hee Choi, Cheonan-Si (KR)

(73) Assignee: Mirae Corporation, Cheonan-si (KR)

( * ) Notice: Subject to any disclaimer, the term of this patent is extended or adjusted under 35 U.S.C. 154(b) by 0 days.

(21) Appl. No.: 12/039,045

(22) Filed: Feb. 28, 2008

(65) Prior Publication Data

US 2008/0297140 A1 Dec. 4, 2008

(30) Foreign Application Priority Data

May 31, 2007 (KR) ...................... 10-2007-0053548

(51) Int. Cl.
*G01R 31/02* (2006.01)
(52) U.S. Cl. .................................................... 324/763
(58) Field of Classification Search ............. 324/158.1, 324/750–758, 760–765; 209/573; 301/688–697; 439/259, 482

See application file for complete search history.

(56) References Cited

U.S. PATENT DOCUMENTS

| | | | | |
|---|---|---|---|---|
| 5,227,717 A | * | 7/1993 | Tsurishima et al. | ......... 324/754 |
| 6,287,878 B1 | * | 9/2001 | Maeng et al. | ................. 438/15 |

FOREIGN PATENT DOCUMENTS

| | | |
|---|---|---|
| KR | 100223093 | 7/1999 |
| KR | 100560729 | 3/2006 |

* cited by examiner

*Primary Examiner*—Ha Tran T Nguyen
*Assistant Examiner*—Trung Q Nguyen
(74) *Attorney, Agent, or Firm*—Ked & Associates, LLP

(57) ABSTRACT

A handler for handling semiconductor chips during a testing process includes a loading position at which packaged chips are loaded into a test tray, and an unloading position at which the packaged chips are unloaded from the test tray. The test tray follows a path through the handler from the loading position to the unloading position, and from the unloading position to the loading position. By separately performing the loading and unloading operations at these different positions within the handler, malfunctions in loading and unloading pickers that load and unload the chips may be reduced. Further, a malfunction in one picker performing one operation may be prevented from influencing operations of the other picker performing another operation. Additionally, collision between the loading picker and the unloading picker may be prevented.

22 Claims, 8 Drawing Sheets

SYSTEM AND METHOD FOR TRANSFERRING TRAYS WITHIN A TEST HANDLER

BACKGROUND

1. Field

This relates to a handler, and in particular, to a method for transferring a test tray within the handler.

2. Description

A handler may be used to perform electrical tests on packaged chips at the conclusion of a packaging process. Such a handler transfers packaged chips from a user tray to a test tray and supplies the test tray containing the packaged chips to a tester including a test board having a plurality of sockets. The packaged chips in the test tray are brought into contact with the sockets to perform an electrical test on the packaged chips. The packaged chips are graded according to the test results, and the handler transfers the graded chips from the test tray to appropriate user trays based on the grading. As the packaged chips on the trays move within the handler for loading, testing and unloading, movement of the various devices that convey the trays should be coordinated for efficient, error free processing.

BRIEF DESCRIPTION OF THE DRAWINGS

The embodiments will be described in detail with reference to the following drawings in which like reference numerals refer to like elements wherein.

DETAILED DESCRIPTION

Figure 1:
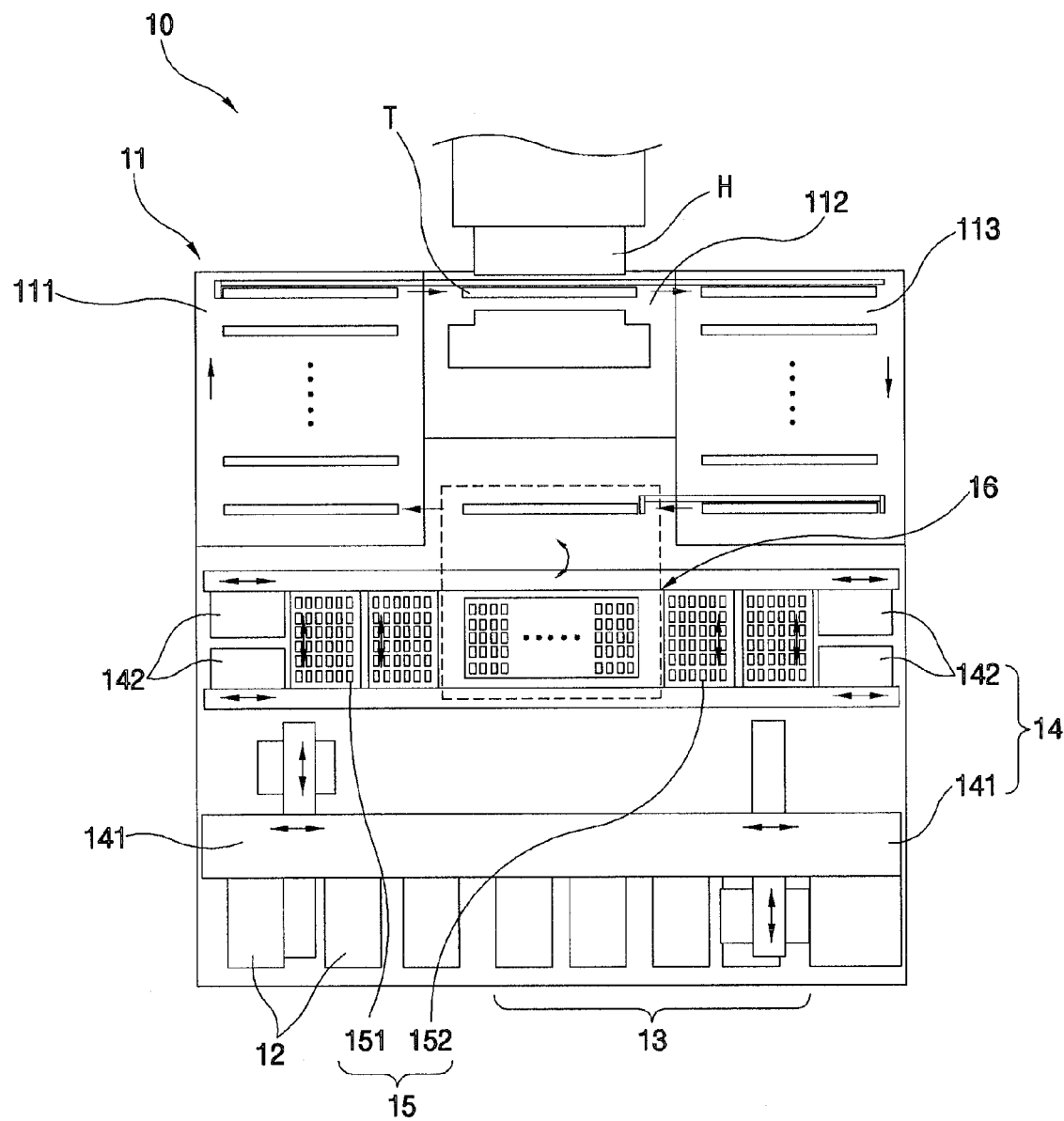
FIG. 1 is a top view of an exemplary handler.
Figure 2:
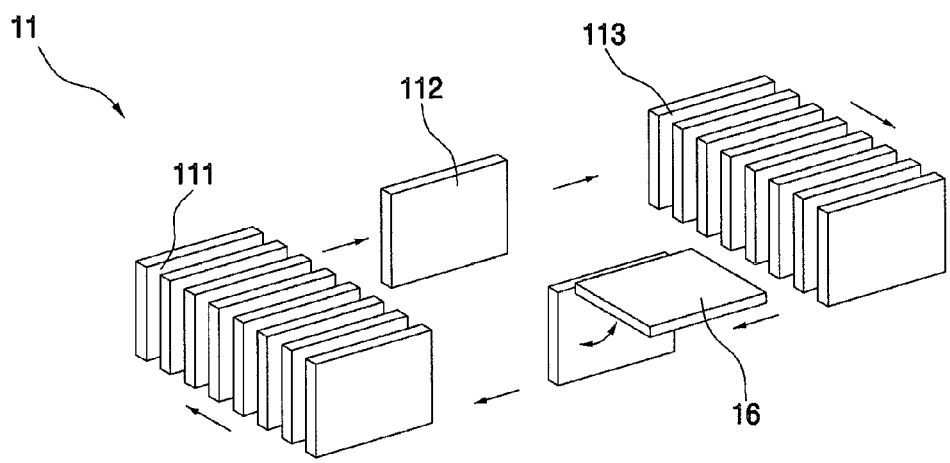
FIG. 2 illustrates a path which a test tray follows in the handler shown in FIG. 1.

The exemplary handler 10 shown in FIG. 1 includes a chamber system 11 having first, second, and third chambers 111, 112 and 113, respectively. In the first chamber 111, packaged chips in a test tray T are brought to a desired test temperature. For example, the packaged chips may be heated to an extremely high temperature or cooled to an extremely low temperature. In the second chamber 112, the packaged chips in the test tray T may be subjected to an electrical test. In the third chamber 113, the packaged chips in the test tray may be cooled or heated as necessary, for example, to room temperature. The handler 10 may also include a loading stacker 12, an unloading stacker 13, a picker system 14, a buffer unit 15, and an exchanging site 16.

The test tray T containing the packaged chips may be moved into the first chamber 111 from the exchanging site 16. The packaged chips in the test tray T may be heated or cooled as described above as the test tray T is moved forward within the first chamber 111. Thereafter, the test tray T may be moved from the first chamber 111 into the second chamber 112. The second chamber 112 may have a window, through which the packaged chips in the test tray T may come into contact with corresponding sockets of a test board H so as to be electrically tested by an outside tester. After the packaged chips are all tested, the test tray T may be moved into the third chamber 113. The packaged chips in the test tray T may be cooled or heated to room temperature as the test tray T is moved forward within the third chamber 113. Thereafter, the test tray T may be moved to the exchanging site 16.

In certain embodiments, two or more user trays, each containing packaged chips intended for electrical testing, may be positioned in the loading stacker 12. The user tray, when empty, may be moved to the unloading stacker 13 to receive packaged chips after testing. Each of the empty user trays in the unloading stacker 13 may be assigned a grade code associated with the packaged chips it is to receive. Thus, the tested packaged chips, after grading, may be transferred to an appropriate user tray positioned in the unloading stacker 13.

The picker system 14 may include a first picker 141 and a second picker 142, each of which may pick up one, two, or more packaged chips. The first picker 141 may be provided with an X-Y gantry positioned above the loading stacker 12 so as to be movable in the X-axis direction and in the Y-axis direction. The first picker 141 may pick up a packaged chip intended for electrical test from a user tray in the loading stacker 12, and place it into the buffer unit 15, or into a user tray in the unloading stacker 13. The picker system 14 may include two or more first pickers 141 and two or more second pickers 142. The second picker 142 may be provided with an X-axis gantry positioned above the buffer unit 15 so as to be movable in the X-axis direction. The second picker 142 may transfer a packaged chip from the buffer unit 15 to the exchanging site 16 or from the exchanging site 16 to the buffer unit 15.

Packaged chips may be temporarily placed in the buffer unit 15 during transfer from the loading stacker 12 to the exchanging site 16 or from the exchanging site 16 to the unloading stacker 13. The buffer unit 15 may include a loading buffer unit 151 and an unloading buffer unit 152. The loading buffer unit 151 may be provided adjacent to one side of the exchanging site 16 so as to be movable in the Y-axis direction and temporarily receive a packaged chip after the first picker 141 picks it up from the user tray in the loading stacker 12. The first picker 141 may temporarily place the packaged chip on the loading buffer unit 151 which comes to receive it. The second picker 142 may be moved in the X-axis direction after picking up the packaged chip placed on the loading buffer unit 151, and place it into the test tray T at the exchanging site 16.

The unloading buffer unit 152 may be provided adjacent to the other side of the exchanging site 16 so as to be moved in the Y-axis direction and temporarily receive a tested packaged chip after the second picker 142 picks it up from the test tray T in the exchanging site 16. The second picker 142 may temporarily place the tested packaged chip on the unloading buffer unit 152 which comes to receive it. The first picker 141 may pick up the tested packaged chip placed on the unloading buffer unit 152, move in the X-axis and Y-axis directions, and place it into the appropriate user tray in the unloading stacker.

After receiving the packaged chips intended for electrical testing, the test tray T may be moved from the exchanging site 16 to the chamber system 11. After the packaged chips are tested in the chamber system 11, the test tray T containing the tested packaged chips may be moved from the chamber system 11 to the exchanging site 16.

Tested packaged chips may be unloaded from the test tray T at the exchanging site 16, and at the same time packaged chips intended for electrical testing may be loaded into the test tray T. That is, one of the second pickers 142 may pick up tested packaged chips from a carrier of the test tray T and at the same time the other of the second pickers 142 may place packaged chips intended for electrical testing into the empty carrier of the test tray T. Thus, the action of the second pickers 142, combined with the buffer unit 15 and the exchanging site 16, may provide for efficient movement of tested and to-be-tested packaged chips within the handler 10 to maximize processing speed and capacity.

However, a malfunction of one of the main components of the handler 10, such as one of the pickers, during one operation may prevent another parallel or serial operation from being carried out. For example, the complexity of the program for simultaneously loading and unloading the tested/to-be-tested packaged chips may result in errors in the controlling operations of the pickers, and the second pickers may collide with each other because the loading and unloading operations are performed at the same time.

Figure 3:
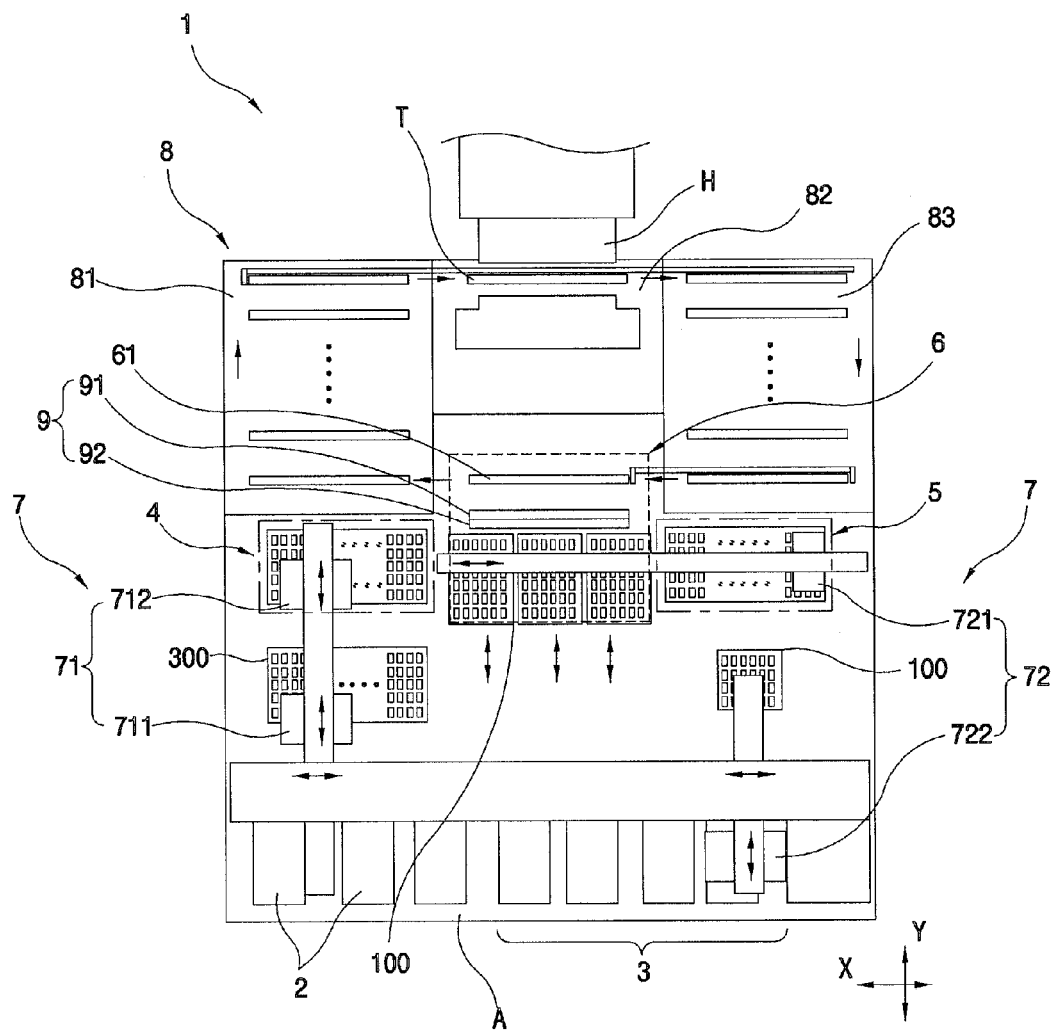
FIG. 3 is a top view of a handler according to an embodiment as broadly described herein.

The handler 1 shown in FIG. 3 may include a loading stacker 2, an unloading stacker 3, a loading unit 4, an unloading unit 5, a rotating unit 6, a picker system 7, a chamber system 8, and transferring unit (not shown in FIG. 3).

Two or more user trays, containing packaged chips intended for electrical testing, may be positioned in the loading stacker 2. The loading stacker 2 may be provided at a front part of the handler 1, or other location as appropriate. The test tray T, when empty, may be moved from the loading stacker 2 to the unloading stacker 3.

Two or more empty user trays may be positioned in the unloading stacker 3. Each of the empty user trays may be assigned a grade code associated with the packaged chips it is to contain. Thus, after grading, the tested packaged chips may be loaded into the appropriate user tray. When the user tray is filled with tested packaged chips of the same grade, it may be removed from the unloading stacker 3. Another empty user tray may then take the place of the removed user tray so as to receive tested packaged chips of the same grade.

Figure 4A:
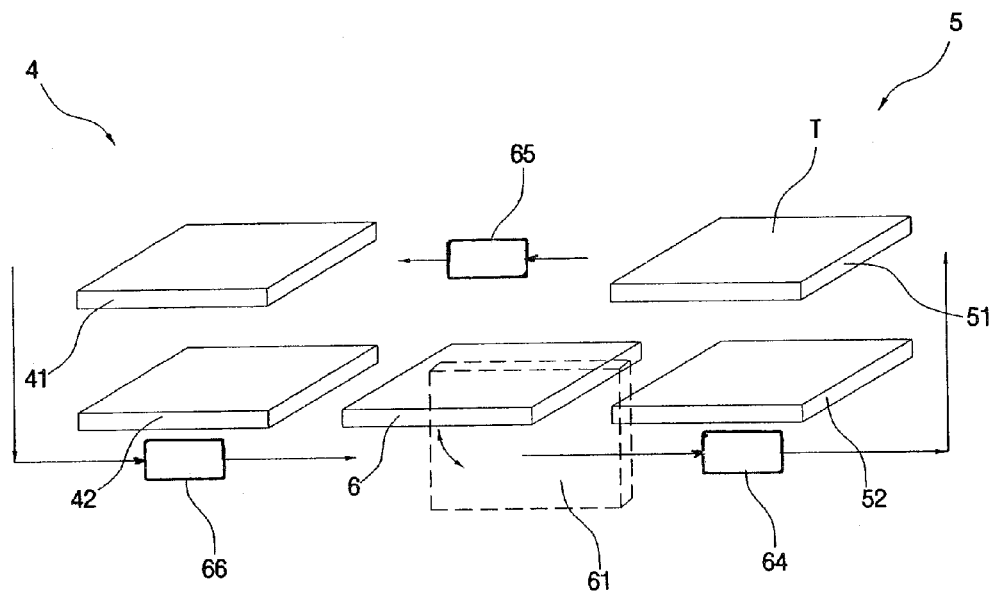
FIGS. 4A-4B illustrate a path which a test tray follows between a loading unit and an unloading unit in the handler shown in FIG. 3 and the mechanisms that provide for movement along such a path.
Figure 4B:
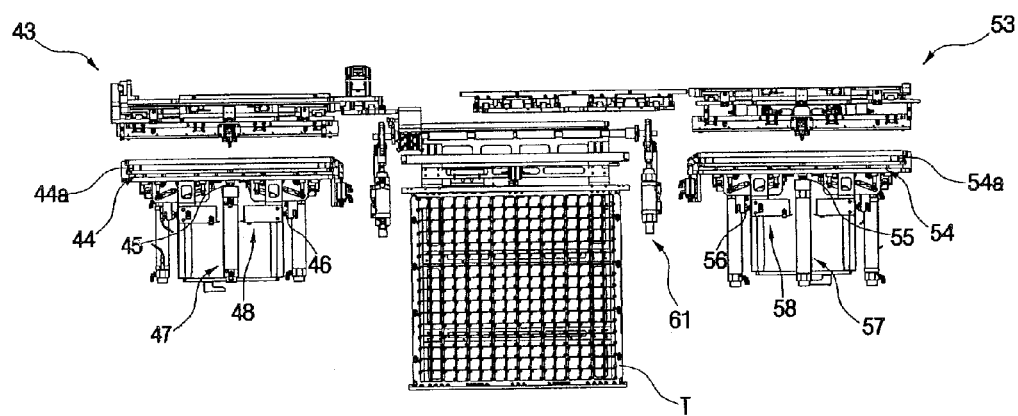

As shown in FIGS. 3 and 4A-4B, the loading unit 4 may move the test tray T up and down between a loading position 41 and a departing position 42. To facilitate this movement, the loading unit 4 may include a first ascending/descending unit 43 and a first pushing unit 44.

In the embodiment shown in FIG. 4A, the loading position 41 is a position at which packaged chips are loaded into the test tray T. After the test tray T has been emptied in the unloading unit 5, the test tray T may be moved back to the loading position 41. The departing position 42 is a position at which the test tray T, after being filled with the packaged chips, departs the loading unit 4 for the rotating unit 6. As shown in FIG. 4A, the loading position 41 may be located above the departing position 42. The test tray T, after being filled with packaged chips at the loading position 41, may be moved down to the departing position 42, and subsequently to the rotating unit 6.

The first pushing unit 44 may be coupled to the first ascending/descending unit 43 so as to ascend and descend along with the first ascending/descending unit 43. When the test tray T arrives at the loading position 41, the first pushing unit 44 may push a latch of a carrier of the test tray T upward to make it open so that packaged chips may be loaded into the carrier of the test tray T. Once the packaged chips are loaded into the carrier of the test tray T, the first pushing unit 44 may move away from the latch, allowing the latch to re-engage and hold the packaged chips firmly in place in the carrier of the test tray T. In certain embodiments, the first pushing unit 44 may include two or more pushing pins 44a, each pushing the latch of the carrier of the test tray T.

In certain embodiments, the first ascending/descending unit 43 may ascend and descend by being connected to a first connecting rod 45 of a first cylinder 47 provided with the loading unit 4, and the first pushing unit 44 may ascend and descend by being connected to a second connecting rod 46 of a second cylinder 48 provided with the first ascending/descending unit 43.

The test tray T containing tested packaged chips may be moved to the unloading unit 5 from the exchanging site 16. In the unloading unit 5, tested packaged chips, after grading, may be unloaded from the test tray T. To facilitate this, the unloading unit 5 may include an arriving position 52 and an unloading position 51. In the embodiment shown in FIG. 4A, the arriving position 52 is a position at which a test tray containing tested packaged chips arrives from the exchanging site 16. The unloading position 51 is a position at which tested packaged chips may be unloaded from the test tray T.

The test tray T may be moved up and down between the unloading position 51 and the arriving position 52. The unloading unit 5 may include a second ascending/descending unit 53 that moves the test tray T up and down, and a second pushing unit 54 which opens and closes the latch of the carrier of the test tray T at the unloading position 51.

The tested packaged chips, after grading based on results of the electrical testing, may be unloaded from the test tray T at the unloading position 51. In the embodiment shown in FIG. 4A, the unloading position 51 is located above the arriving position 52. The test tray T containing the tested packaged chips may be moved to the arriving position 52 from the exchanging site 16 and subsequently moved up to the unloading position 51.

In certain embodiments, the loading and unloading positions 41 and 51 may be arranged horizontally, in a row relative to each other, so that the test tray T may be horizontally moved from the unloading position 51 to the loading position 41. The departing position 42, the rotating unit 6, and the arriving position 52 may be arranged horizontally, in a row relative to each other, so that the test tray T may be horizontally moved from the departing position 42 to the rotating unit 6 or from the rotating unit 6 to the arriving position 52. The loading position 41 may be located over the departing position 42 and the unloading position 51 over the arriving position 52. Other arrangements may also be appropriate.

The second ascending/descending unit 53 may move the test tray T between the unloading position 51 and the arriving position 52 as appropriate. The second pushing unit 54 may be connected to the second ascending/descending unit 53 so as to ascend and descend together with it. When the test tray T arrives at the unloading position 51, the second pushing unit 54 may push the latch of the carrier of the test tray T upward to make it open so that packaged chips may be unloaded from the carrier of the test tray T. The second ascending/descending unit 53 may ascend and descend by being connected to a third connecting rod 55 of a third cylinder 57 provided with the unloading unit 5, and the second pushing unit 54 can ascend and descend by being connected to a fourth connecting rod 56 of a fourth cylinder 58 provided with the second ascending/descending unit 53. The second pushing unit 54 may include two or more pushing pins 54a, each opening the latch of the carrier of the test tray.

The rotating unit 6 may include a rotator 61 that rotates the test tray T between an upright position and a horizontal position. After being rotated to the upright position by the rotator 61, the test tray T containing packaged chips may be moved into the chamber system 11. After the packaged chips are tested, the test tray T may be moved from the chamber system 11 back to the rotating unit 6, where the rotating unit 6 rotates the upright test tray T back to the horizontal position. The horizontally-positioned test tray T may then be moved from the rotating unit 6 to the arriving position 52 and subsequently moved up to the unloading position 51.

Thus, in the loading unit 4, packaged chips intended for electrical testing may be loaded into the horizontally-positioned test tray T. Likewise, in the unloading unit 5, tested packaged chips may be unloaded from the horizontally-positioned test tray T. In the chamber system 11, the packaged chips contained in the upright-positioned test tray T may be moved to the test board H for electrical testing.

The picker system 7 may include a loading picker 71 and an unloading picker 72. The loading picker 71 may pick up packaged chips from a user tray in the loading stacker 2 and place them into a test tray T at the loading position 41. The unloading picker 72 may pick up tested packaged chips from a test tray T at the unloading position 51 and place them into a user tray in the unloading stacker 3. Each of the loading and unloading pickers 71 and 72 may have two or more nozzles that pick up packaged chips by sucking air into the nozzles.

At least one loading picker 71 may be provided on the X-Y gantry such that it is movable in the X-axis and Y-axis directions between the loading stacker 2 and the loading position 41. The X-Y gantry may be positioned above the loading unit 4. A loading buffer 300 may be provided between the loading stacker 2 and the loading position 41. In certain embodiments, the loading picker 71 may include a first loading picker 711 and a second loading picker 712 to speed up the loading operation. The first picker 711 may pick up packaged chips from a user tray in the loading stacker 2 and place them on the loading buffer 300. The second loading picker 712 may pick up packaged chips from the loading buffer 300 and place them on a test tray T at the loading position 41. The loading buffer 300, movable in the Y-axis direction, may maintain a balance between speeds of the first and second pickers 711 and 712.

At least one unloading picker 72 may be provided on the X-Y gantry such that it is movable in the X-axis and Y-axis directions between the unloading stacker 3 and the loading position 51. An unloading buffer 100 may be provided between the unloading stacker 3 and the unloading position 51 to control the unloading speed. The unloading picker 72 may include a first unloading picker 721 and a second unloading picker 722. The first unloading picker 721 may pick up packaged chips from a test tray T at the unloading position 51 and place them on the unloading buffer 100. The second unloading picker 722 may pick up packaged chips from the unloading buffer 100 and place them into a user tray in the unloading stacker 3. Each of the first and second unloading pickers 721 and 722 may have two or more nozzles, each nozzle capable of picking up one packaged chip.

Thus, the loading and unloading pickers 71 and 72 may load and unload packaged chips independently of each other, and in separate areas of the handler 1, as described above, without a risk of colliding with each other. Division of the loading operation and the unloading operation in this manner simplifies motion and control of the loading and unloading pickers 71 and 72, thereby reducing possible malfunction.

The chamber system 8 may include a first chamber 81, a second chamber 82, and a third chamber 83. Packaged chips contained in a test tray T may come into contact with sockets of the test board H inside the second chamber 82 for electrical testing.

The test tray T, after being received by the rotating unit 6 from the departing position 42 and rotated to the upright position by the rotating unit 6, may be moved into the first chamber 81. The packaged chips in the test tray T may be heated or cooled as described above during their passage inside the first chamber 81. Once the packaged chips reach a desired test temperature, the test tray T may be moved into the test chamber 82.

Inside the second chamber 82, the packaged chips contained in the test tray T may come into contact with the sockets of the test board H for electrical testing. The second chamber 82 may include a window through which the packaged chips come into contact with the socket of the test board H, located outside the handler 1. A pushing unit (not shown) may also be provided to push the test tray T toward the test board H and force contact between the packaged chips and the sockets of the test board H. After the packaged chips are all tested inside the second chamber 82, the test tray T may be moved from the second chamber 82 into the third chamber 83, where the packaged chips may be cooled or heated to room temperature. The test tray T may then be moved to the rotating unit 6.

Figure 5:
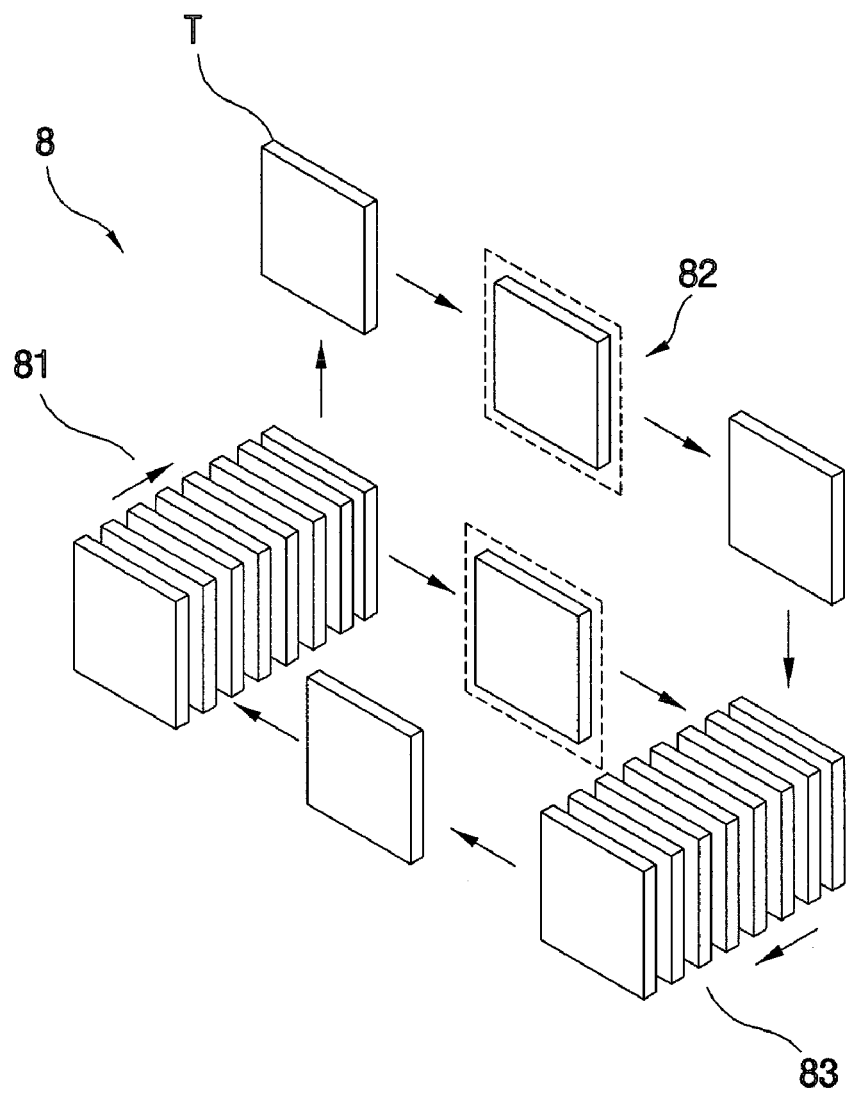
FIG. 5 illustrates a path which the test tray follows inside a chamber system having horizontally arranged first, second and third chambers of the handler shown in FIG. 3.

As shown in FIG. 5, in certain embodiments, the first, second, and third chambers 81, 82, and 83 may be arranged horizontally, in a row relative to each other. Two or more test trays T, each of which contains packaged chips, may be moved inside the second chamber 82 having two or more windows. In this case, the packaged chips contained in each of the test trays T come in contact with corresponding sockets through corresponding windows. Thus, the packaged chips contained in the two or more test trays T may all be tested at once.

Figure 6:
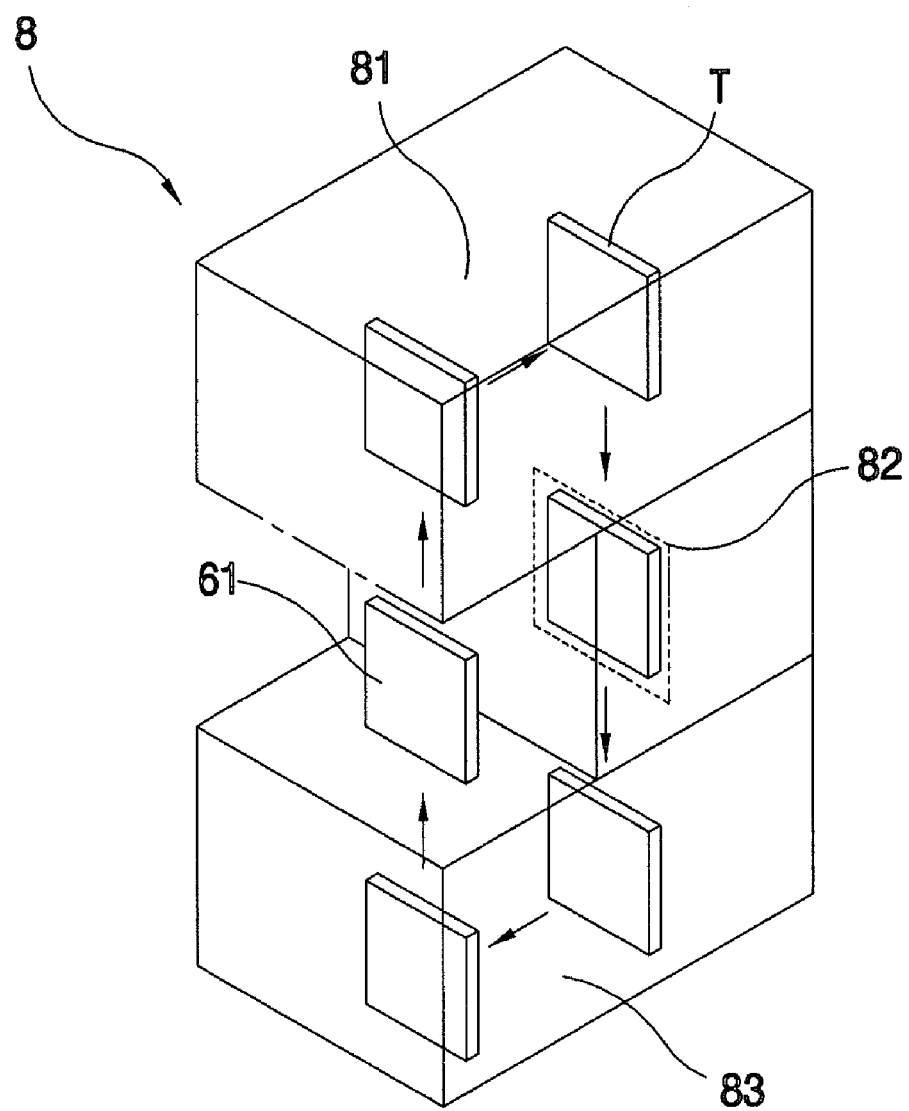
FIG. 6 illustrates a path which the test tray follows inside a chamber system having vertically arranged first, second and third chambers of the handler shown in FIG. 3.

As shown in FIG. 6, in alternative embodiments, the first, second, and third chambers 81, 82, and 83 may be arranged vertically, in a column relative to each other. The first chamber 81 may be located over the third chamber 83, with the second chamber 82 positioned therebetween.

The trays T may be moved horizontally by a transferring unit, which may include a first transferring unit 64, a second transferring unit 65, and a third transferring unit 66. The first transferring unit 64 may move the test tray T from the rotating unit 6 to the arriving position 52. The second transferring unit 65 may move the test tray T, from which packaged chips have been unloaded, from the unloading position 51 to the loading position 41. The third transferring unit 66 may move the test tray T, filled with packaged chips intended for electrical testing, from the departing position 41 to the rotating unit 6.

The handler may also include a guiding unit 9, and a waiting buffer 200. As shown in FIGS. 3, 4A-4B and 7, the guiding unit 9 may guide motion of a test tray T between the loading position 41 and the unloading position 51. In certain embodiments, the guiding unit 9 may be a pair of guide rails in which one rail is a fixed guide 91 and the other is a movable guide 92.

The fixed guide 91 may be fixed to a main body A of the handler 1 and located between the loading position 41 and the unloading position 51. The fixed guide 91 may guide motion of a test tray T in the X-axis direction from the unloading position 51 to the loading position 41. That is, one lateral side of the test tray T may be engaged by the fixed guide 91 and may slide along the fixed guide 91. The movable guide 92 may be separated by a width of a test tray T in the Y-axis direction from the fixed guide 91. The opposite lateral side of the test tray T may be engaged by the moveable guide 92.

Thus, the fixed guide 91 and the movable guide 92, parallel to each other, may cooperate to guide the motion of a test tray T between the unloading position 51 and the loading position 41. Thus, the test tray T may move from the unloading position 51 to the loading position 41, with its opposite lateral sides supported by the fixed and movable guides 91 and 92.

After the test tray T moves from the unloading position 51 to the loading position 41, the movable guide 92 may return to its initial position, thereby providing a moving space in which the unloading buffer 100 may freely move. Thus, the moving space between the loading position 41 and the unloading position 51 may be shared by the unloading buffer 100 and the guiding unit 9, reducing a size of the handler 1.

In certain embodiments, both the fixed and movable guides 91 and 92 may be U-shaped rails. One lateral side of the test tray T may be inserted into an inside space of the fixed guide 91, and the other lateral side of the test tray T may be inserted into an inside space of the movable guide 92.

As shown in FIGS. 3, 4A-4B, and 7, the unloading buffer 100 may be movable in the Y-axis direction between the loading position 41 and the unloading position 51. In certain embodiments, two or more unloading buffers 100 may be provided, depending upon the speed of unloading the packaged chips from the test tray T.

The unloading buffer 100 remains out of the moving space while a test tray T is moved from the unloading position 51 to the loading position 41 to prevent the unloading buffer 100 from colliding with the test tray T. The unloading buffer 100 serves to reduce a time for the unloading operation, and to control a speed of the unloading operation by being moved in the moving space while the packaged chips are unloaded from a test tray T. Thus, the tested packaged chips may be placed on the unloading buffer 100 before being moved from the test tray T at the unloading position 51 to the user tray in the unloading stacker 3.

Packaged chips may be temporarily stored in the waiting buffer 200 until an empty user tray is available in the unloading stacker 3. The waiting buffer 200 may allow packaged chips to be transferred from the unloading position 51, even while an empty user tray is not available in the unloading stacker 3. This results in reducing an unloading time for tested packaged chips.

The second loading picker 722 may transfer packaged chips from the unloading buffer 72 to the waiting buffer 200 until an empty user tray is available in the unloading stacker 3. Packaged chips may be transferred from the waiting buffer 200 to an empty user tray when one is available in the unloading stacker 3. That is, tested packaged chips may be unloaded from the test tray T and be temporarily placed on the waiting buffer 200 until an empty user tray is available in the unloading stacker 3.

A method for transferring a test tray as embodied and broadly described herein will now be described referring to FIGS. 3 through 8.

A loading picker 71 picks up a packaged chip intended for electrical testing from a loading stacker 2 and places it into a test tray T provided at a loading position 41 (referred to as 'a loading operation') (S100).

A loading buffer 300 may be provided between the loading stacker 2 and the loading position 41. In this case, the loading picker 71 picks up the packaged chip intended for electrical testing from the loading stacker 2 and temporarily places it on the loading buffer 300. Subsequently, the loading picker 71 picks up the packaged chip from the loading buffer 300 and places it into the test tray T provided at the loading position 41.

Once the test tray T is filled with packaged chips intended for electrical testing, the test tray T is moved vertically down from the loading position 41 to a departing position 42 within the loading unit 4. Subsequently, the test tray T is moved from the departing position 42 within the loading unit 4 to a rotating unit 6 (S200). The departing position 42 and the rotating unit 6 may be arranged horizontally, in a straight line, in which case the test tray T is also moved horizontally. A first ascending/descending unit 53 moves the test tray T vertically up. A third transferring unit 66 moves the test tray T horizontally from the departing position 42 to the rotating unit 6.

The rotating unit 6 rotates the test tray T from a horizontal position to a vertically upright position (S300). The upright-positioned test tray T is moved into a chamber system 8 for testing (S400). More specifically, the upright-positioned test tray T is moved from the rotating unit 6 into the first chamber 81 to be brought to a desired test temperature, the second chamber 82 for testing, and the third chamber 83 to be brought to room temperature as described above, and then returned to the rotating unit 6. As described above, the testing operation may include heating packaged chips to an extremely high temperature or cooling the packaged chips to an extremely low temperature while the test tray T is moved within the first chamber 81, bringing the packaged chips into contact with sockets of a test board H inside the second chamber 82, and cooling or heating the packaged chips to room temperature as the test tray T moves within the third chamber 83. The testing operation may also include pushing the test tray T toward the test board inside the second chamber 82.

After the testing operation is complete, the test tray T containing the tested packaged chips may be moved back to the rotating unit 6 from the chamber system 8 (S500). The rotating unit 6 rotates the upright-positioned test tray T back to the horizontal position (S600).

A first transferring unit 64 moves the test tray T horizontally from the rotating unit 6 to the arriving position 52 of the unloading unit 5. A second ascending/descending unit moves the test tray T vertically up from the arriving position 52 to the unloading position 51 of the unloading unit (S700).

At the same time, a test tray T filled with packaged chips may be moved to the rotating unit 6 from the departing position 41 and then to the arriving position 52 from the rotating unit 6.

The packaged chips are unloaded from the test tray T positioned at the unloading position 51 of the unloading unit 5 and transferred to the unloading stacker 3 (S800). More specifically, the first unloading picker 721 transfers the packaged chips from the unloading position 51 to an unloading buffer 100 and subsequently a second unloading picker 722 transfers the packaged chips from the unloading buffer 100 to the unloading stacker 3. The second unloading picker 722 may transfer the packaged chips by way of a waiting buffer 200. The test tray T, when empty, may be moved to the loading position 41 from the unloading position 51.

The unloading buffer 100 may be moved out of a moving space which it occupies before the test tray T is moved from the unloading position 51 to the loading position 41. At the same time, the guiding unit 9 may be widened by a width of the test tray T to provide a path which the test tray T follows in the moving space.

A process for manufacturing a packaged chip as embodied and broadly described herein will now be described. This process, employed in the handler 1 as embodied and broadly described herein, includes the method for transferring a packaged chip as set forth above. Thus, only the steps that distinguish the two methods from each other will be described.

Figure 7:
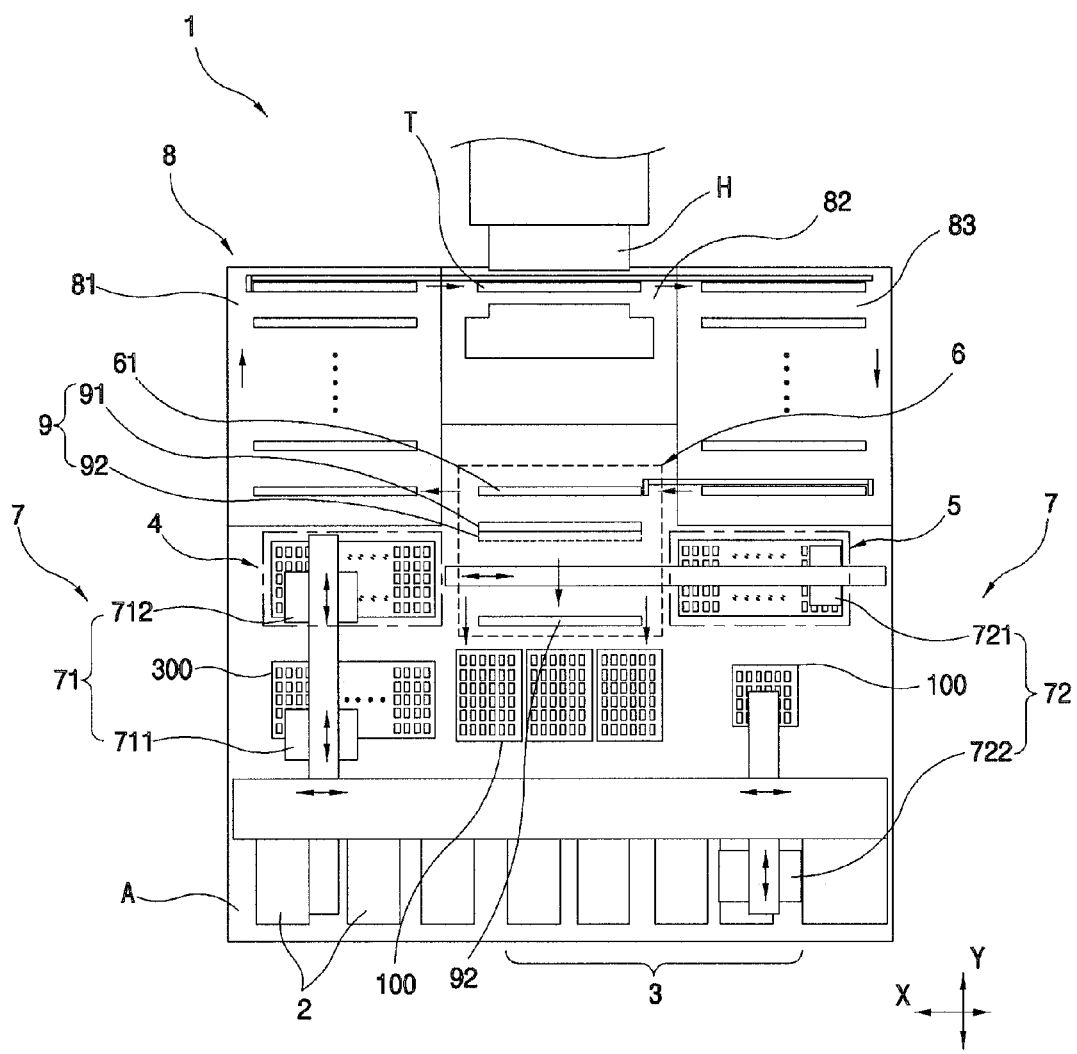
FIG. 7 is a top view of the handler shown in FIG. 3, illustrating a path along which a test tray is moved from an unloading position to a loading position.
Figure 8:
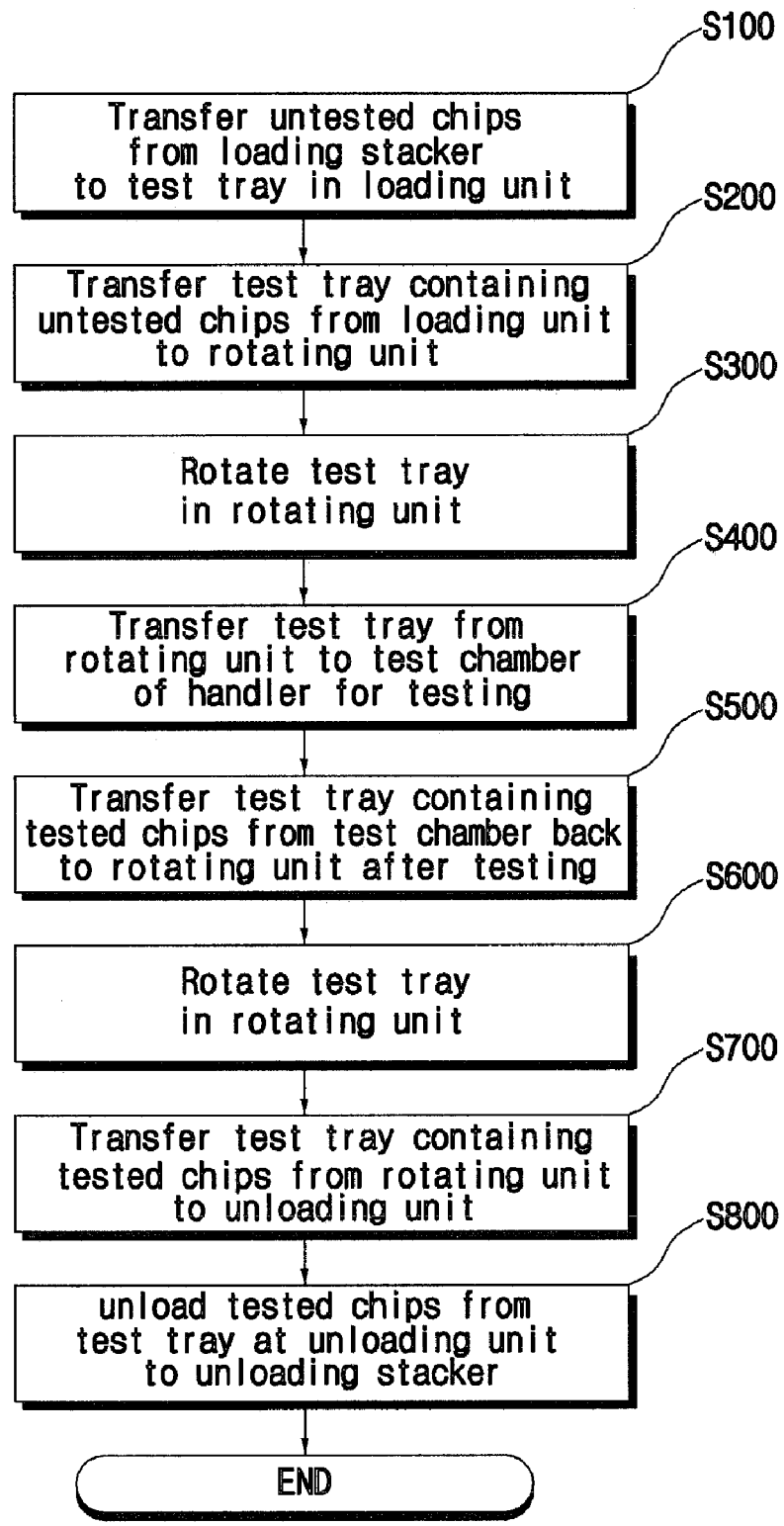
FIG. 8 is a flow chart of a method of transferring a test tray in a handler as embodied and broadly described herein.

Referring to FIGS. 3 and 7, a packaged chip is prepared which is intended for electrical testing. That is, the packaged chip is loaded into a user tray and the user tray is placed in a loading stacker 2. The packaged chip includes a memory and non-memory device. Next, the packaged chip is loaded from the user tray into a test tray T. That is, a loading picker 71 picks up the packaged chip intended for electrical testing from the user tray in the loading stacker 2, and transfers it and places it into the test tray T at the loading position 41.

Individual performance of the loading and unloading operations at the different positions described above reduces an occurrence of malfunctions in the loading and unloading pickers, and prevents a malfunction in one picker performing one operation from influencing operation of the other picker performing another operation. Furthermore, collision between the loading picker and the unloading picker may be avoided. Additionally, sharing of the moving space between the guiding unit and the unloading buffer reduces size and structure of the handler.

A handler capable of individually performing a loading operation and an unloading operation, a method for transferring a test tray, used in the handler, and a process for manufacturing a packaged chip, using the handler, are provided.

A handler capable of simplifying control of motions of a loading picker and an unloading picker, a method for transferring a test tray, used in the handler, and a process for manufacturing a packaged chip, using the handler, are provided.

A handler capable of preventing a loading picker and an unloading picker from colliding with each other, a method for transferring a test tray, used in the handler, and a process for manufacturing a packaged chip, using the handler, are provided.

A handler in accordance with an embodiment as broadly described herein may include a rotating unit rotating a test tray to change the test tray's position from the horizontal position to the upright position or from the upright position to the horizontal position, a loading unit including a loading position, located adjacent to one side of the rotating unit, where the test tray waits to contain a packaged chip intended for a test and a departing position, located below the loading position, where the test tray, which arrived from the loading position, departs for the rotating unit, an unloading unit including an unloading position, located adjacent to the opposite side of the rotating unit, where the test tray wait for a tested packaged chip to be unloaded from it and an arriving position, located below the unloading position, where the test tray arrives from the rotating unit, a chamber system where the packaged chips are tested which are contained in the test tray transferred from the rotating unit, a loading stacker, positioned in front of the loading unit, where the packaged chips intended for the tests are placed, an unloading stacker, positioned in front of the unloading unit, where the tested packaged chips, after graded, are placed, at least one picker system transferring the packaged chips from the loading stacker to the loading unit, or from unloading unit to the unloading stacker, and a transferring unit transferring the test tray.

A method for transferring a test tray in accordance with an embodiment as broadly described herein may include loading a packaged chip intended for a test into a test tray waiting at an loading position, transferring the test tray from the loading position to the rotating unit by way of a departing position, performing the tests on the packaged chips contained in the test tray which is transferred into a chamber system from the rotating unit, transferring the test tray containing the tested packaged chips from the chamber system to the rotating unit, transferring the test tray from the rotating unit to an unloading position by way of an arriving position, unloading the tested packaged chip from the test tray at the unloading position, and transferring the test tray from the unloading position to the loading position.

A process for manufacturing a packaged chip in accordance with an embodiment as broadly described herein may include loading a packaged chip into a test tray waiting at a loading position, transferring the test tray from the loading position to a rotating position by way of a departing position, performing the tests on the packaged chips contained in the test tray which is transferred into a chamber system from the rotating unit, transferring the test tray containing the tested packaged chips from the chamber system to the rotating unit, transferring the test tray from the rotating unit to an unloading position by way of an arriving position, unloading the tested packaged chip from the test tray at the unloading position, and transferring the test tray from the unloading position to the loading position.

Any reference in this specification to "one embodiment," "an embodiment," "example embodiment," "certain embodiment," "alternative embodiment," etc., means that a particular feature, structure, or characteristic described in connection with the embodiment is included in at least one embodiment as broadly described herein. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those slilled in the art that will fall within the spirit and scope of the principles of this disclosure. More particularly, various numerous variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A handler, comprising:
   a rotating unit that rotates a test tray between a horizontal position and a vertical position;
   a loading unit provided adjacent to a first side of the rotating unit, the loading unit comprising:
     a loading position that receives test trays for loading thereon of untested packaged chips from a loading stacker; and
     a departing position provided below the loading position, wherein the departing position receives test trays containing untested packaged chips from the loading position for transfer to the rotating unit;
   an unloading unit provided adjacent to a second side of the rotating unit opposite the first side, the unloading unit comprising:
     an arriving position that receives test trays loaded with tested package chips from the rotating unit; and
     an unloading position provided above the arriving position, wherein the unloading position receives test trays loaded with tested packaged chips from the arriving position for unloading to an unloading stacker;

a chamber system that receives test trays of untested packaged chips from the rotating unit, tests the packaged chips, and returns test trays of tested packaged chips to the rotating unit; and a picker system that transfers packaged chips from the loading stacker to the loading unit, and from the unloading unit to the unloading stacker.

2. The handler of claim 1, further comprising a transferring unit that transfers test trays from the departing position to the rotating unit and from the rotating unit to the arriving position.

3. The handler of claim 2, wherein the loading unit further comprises:

a first ascending/descending unit that transfers test trays vertically between the loading position and the departing position; and a first pushing unit coupled to the first ascending/descending unit, wherein the first pushing unit releases packaged chips from test trays positioned at the loading position.

4. The handler of claim 3, wherein the unloading unit further comprises:

a second ascending/descending unit that transfers test trays vertically between the arriving position and the unloading position;

a second pushing unit coupled to the second ascending/descending unit, wherein the second pushing unit releases packaged chips from test trays positioned at the unloading loading position.

5. The handler of claim 1, further comprising:

a guiding unit provided between the loading position and the unloading position to guide movement of test trays between the loading position and the unloading position; and at least one unloading buffer provided between the loading position and the unloading position, wherein the at least one unloading buffer is moveable in the Y-axis direction.

6. The handler of claim 5, wherein the guiding unit comprises:

a fixed guide fixed to a main body of the handler, wherein the fixed guide receives a first edge of a test tray; and a moveable guide positioned parallel to the fixed guide and moveable in the Y-axis direction, wherein the moveable guide receives a second edge of the test tray that is opposite the first edge.

7. The handler of claim 6, wherein the second edge of the test tray is fixed in the moveable guide, and the first edge of the test tray is slideable within the fixed guide such that, as the moveable guide moves in the Y-axis direction with respect to the fixed guide, the test tray moves in the Y-axis direction together with the moveable guide.

8. The handler of claim 5, further comprising a waiting buffer, wherein the waiting buffer receives packaged chips from the unloading buffer for temporary storage until an empty test tray is available in the unloading stacker.

9. The handler of claim 1, wherein the chamber system comprises:

a first chamber that receives test trays containing untested packaged chips from the rotating unit, wherein the first chamber heats or cools the untested packaged chips to a test temperature as the test trays move through the first chamber;

a second chamber that receives the test trays containing untested packaged chips from the first chamber and brings the untested packaged chips into contact with a corresponding plurality of sockets of a test board for testing; and a third chamber that receives the test trays of tested packaged chips from the second chamber and cools or heats the tested packaged chips to an unloading temperature as the test trays move through the third chamber.

10. The handler of claim 9, wherein the first, second and third chambers are arranged vertically, with the first chamber positioned above the second chamber, and the third chamber positioned below the second chamber.

11. The handler of claim 9, wherein the loading position and the unloading position are arranged horizontally in a first row, and the departing position, the rotating unit and the arriving position are arranged horizontally in a second row.

12. The handler of claim 9, wherein the rotating unit receives test trays from the departing position in a horizontal position, rotates the test trays received from the horizontal departing position to a vertical position, and transfers the test trays to the first chamber in the vertical position.

13. The handler of claim 12, wherein the rotating unit receives test trays from the third chamber in a vertical position, rotates the test trays received from the third chamber to a horizontal position, and transfers the test trays to the arriving position in the horizontal position.

14. The handler of claim 1, wherein the picker system comprises:

a first loading picker that transfers packaged chips intended for testing from the loading stacker to a loading buffer provided between the loading stacker and the loading unit;

a second loading picker that transfers packaged chips intended for testing from the loading buffer to the loading unit;

a first unloading picker that transfers tested packaged chips from the unloading unit to a waiting buffer provided between the unloading unit and the unloading stacker; and a second unloading picker that transfers tested packaged chips from the waiting buffer to the unloading stacker.

15. A method of processing a test tray of packaged chips in a handler, the method comprising:

transferring untested packaged chips from a loading stacker to a test tray provided at a loading unit of the handler;

transferring the test tray in a first position from the loading unit to a rotating unit, and rotating the test tray from the first position to a second position in the rotating unit;

transferring the test tray in the second position from the rotating unit to a chamber system of the handler and testing the untested packaged chips contained in the test tray;

transferring the test tray containing the tested packaged chips from the chamber system to the rotating unit in the second position, and rotating the test tray from the second position to the first position in the rotating unit;

transferring the test tray containing the tested packaged chips from the rotating unit to an unloading unit in the first position;

transferring the tested packaged chips from the test tray to an unloading stacker; and transferring the unloaded test tray from the unloading unit to the loading unit.

16. The method of claim 15, wherein transferring untested packaged chips from a loading stacker to a test tray and transferring the test tray from the loading unit to a rotating unit comprises:

transferring untested packaged chips from the loading stacker to a test tray provided at a loading position of the loading unit;

transferring the test tray from the loading position to a departing position of the loading unit, and from the departing position of the loading unit to the rotating unit.

17. The method of claim 16, wherein transferring the test tray containing the tested packaged chips from the rotating unit to an unloading unit, and transferring the tested packaged chips from the test tray to an unloading stacker comprises:

transferring the test tray containing the tested packaged chips from the rotating unit to an arriving position of the unloading unit;

transferring the test tray containing the tested packaged chips from the arriving position to an unloading position of the unloading unit; and unloading the tested packaged chips from the test tray at the unloading position to the unloading stacker.

18. The method of claim 17, wherein transferring the test tray from the unloading unit to the loading unit comprises:

moving an unloading buffer positioned between the loading position and the unloading position out of a path formed between the loading position and the unloading position;

adjusting a width of a guide unit positioned along the path between the loading position and the unloading position to correspond to a width of the test tray to be transferred; and transferring the test tray from the unloading position to the loading position along the guide unit.

19. The method of claim 18, wherein transferring the test tray from the loading position to a departing position, and from the departing position to the rotating unit comprises:

moving the test tray vertically from the loading position to the departing position;

moving the test tray horizontally from the departing position to the rotating unit; and wherein transferring the test tray from the rotating unit to an arriving position, and from the arriving position to an unloading position comprises:

moving the test tray horizontally from the rotating unit to the arriving position; and moving the test tray vertically from the arriving position to the unloading position.

20. The method of claim 19, wherein, when handling multiple test trays, transferring test trays from the loading position to the rotating unit and transferring test trays from the rotating unit to the unloading position is done simultaneously.

21. The method of claim 19, further comprising rotating the test tray in the rotating unit from a horizontal position to a vertical position before transferring the test tray into the chamber system for testing.

22. The method of claim 17, wherein transferring the test tray from the rotating unit into a chamber system of the handler and testing the packaged chips loaded in the test tray comprises:

transferring the test tray into a first chamber of the chamber system and heating or cooling the packaged chips to be tested to a first predetermined temperature;

transferring the test tray from the first chamber into a second chamber of the chamber system, connecting the heated or cooled packaged chips to a corresponding plurality of sockets of a test board, and testing the packaged chips;

transferring the test tray containing the tested package chips from the second chamber into a third chamber of the chamber system, and cooling or heating the tested package chips to a second predetermined temperature; and transferring the test tray containing the tested package chips from the third chamber to the rotating unit.

* * * * *